United States Patent [19]

Wolfson

[11] Patent Number: 4,571,921

[45] Date of Patent: Feb. 25, 1986

[54] EXPENDABLE HEATER SEALING PROCESS

[75] Inventor: Sumner H. Wolfson, Tucson, Ariz.

[73] Assignee: Burr-Brown Corporation, Tucson, Ariz.

[21] Appl. No.: 689,876

[22] Filed: Jan. 9, 1985

Related U.S. Application Data

[62] Division of Ser. No. 298,786, Sep. 2, 1981, Pat. No. 4,507,907.

[51] Int. Cl.[4] .......................... B65B 51/14; B65B 7/28
[52] U.S. Cl. ...................................... 53/373; 156/69; 156/379.7
[58] Field of Search .................... 53/478, 373; 219/87; 156/69, 106, 272.2, 272.4, 273.9, 274.4, 379.6, 379.7

[56] References Cited

U.S. PATENT DOCUMENTS

| | | | |
|---|---|---|---|
| 2,333,412 | 11/1943 | Crandell | 156/379.6 X |
| 2,542,702 | 2/1951 | Prow | 156/379.6 X |
| 2,631,642 | 3/1953 | Richardson et al. | 156/379.6 X |
| 3,767,076 | 10/1973 | Kennedy | 156/69 X |
| 3,874,549 | 4/1975 | Hascoe | 219/87 X |

*Primary Examiner*—Horace M. Culver
*Attorney, Agent, or Firm*—Weiss & Holloway

[57] ABSTRACT

A process and apparatus for sealing electronic packages and lids involves placing a heater preform device between the sealing surfaces of the package and lid. If the package and lid are ceramic, the preform may be metallic having a glass coating fused thereto. Similar glass coatings would be fused to the sealing surfaces of the package and lid. The metallic portion of the preform is then heated by, for example, passing an electrical current therethrough to melt the glass and effect the seal.

1 Claim, 9 Drawing Figures

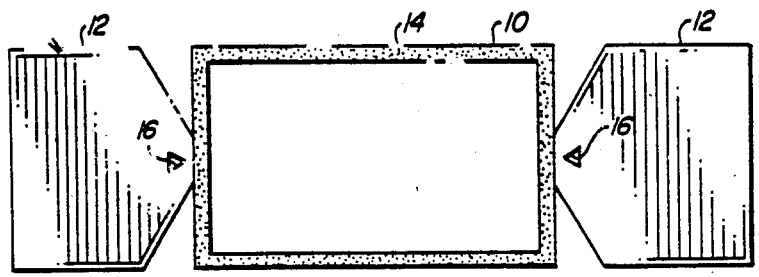 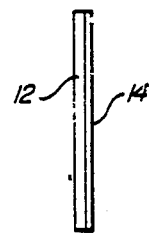
FIG-1a  FIG-1b
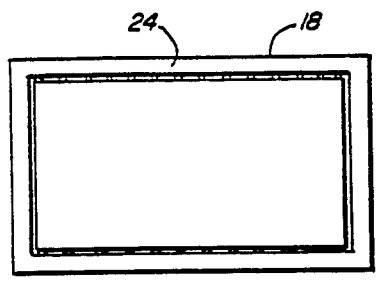 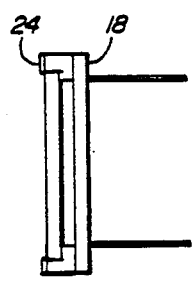
FIG-2a  FIG-2d
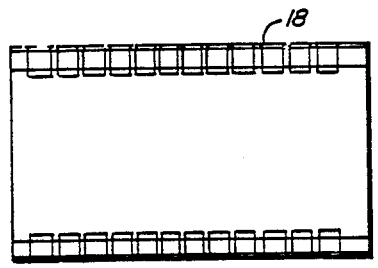 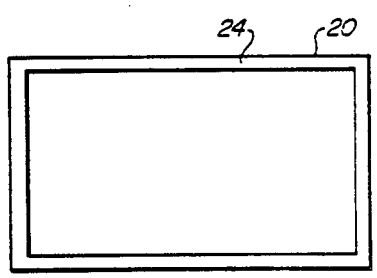
FIG-2b  FIG-3a
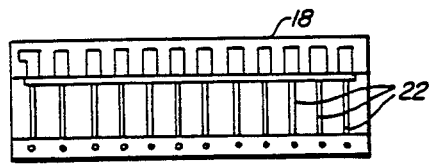 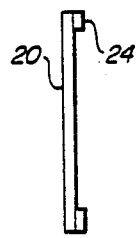
FIG-2c  FIG-3b

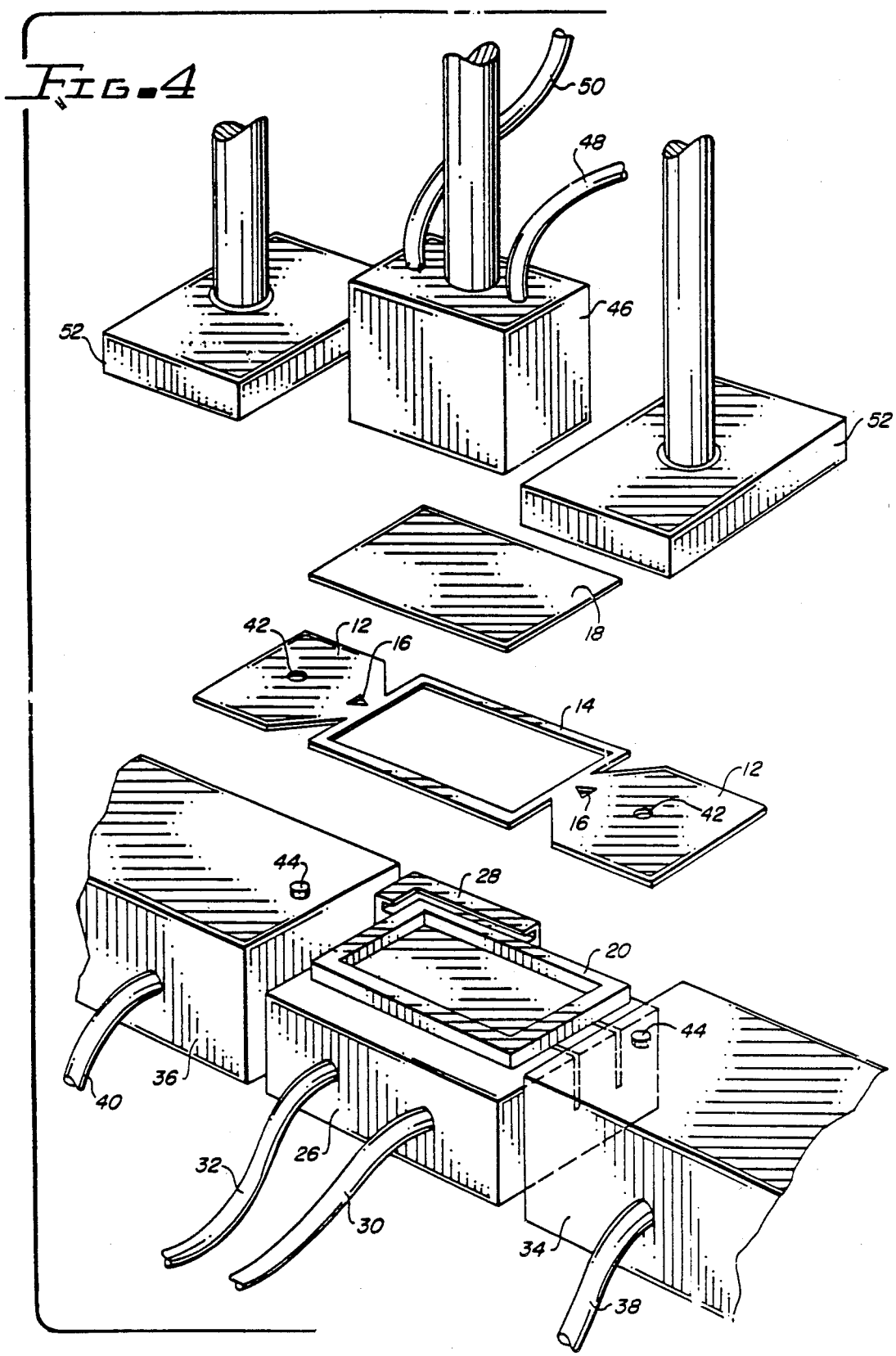

EXPENDABLE HEATER SEALING PROCESS

This is a division of application Ser. No. 298,786, filed Sept. 2, 1981 and now U.S. Pat. No. 4,507,907.

BACKGROUND OF THE INVENTION

1. Field of the Invention

This invention relates generally to a sealing process and an apparatus therefor and, more particularly, to a method and apparatus for hermetically sealing ceramic or metal covers to ceramic packages with a vitreous sealant.

2. Description of the Prior Art

Many electronic circuits and components are packaged in sealed containers to protect them from possible damage due to exposure to the surrounding environment. Sealants employed in the past are (1) metallic sealants such as solders; (2) ceramics including various glasses; and (3) organic sealants such as expoxies. Of these, only the first two will result in a truly hermetic seal since the organic sealants will become permeable to large quantities of matter in a relatively short period of time (e.g. days) when compared to the life of the circuit housed within. If the sealant became permeable to, for example, water vapor, a chemical reaction could take place with certain ions within the package such as chlorine, sodium and potassium to produce corrosive products which would in turn attack wiring and/or the electronic components and hasten failure of the packaged circuit.

Several metal alloys have been employed as sealants with varying results. One very desirable property of a metallic sealant is its ability to withstand high temperatures. For example, ordinary lead-tin solder provides satisfactory seals at temperatures up to 125° C. For temperatures at say 150° C., an alloy of 80 percent gold and 20 percent tin is preferable although obviously expensive. Unfortunately, the melting point of this alloy is approximately 280° C., and fusing the material during the sealing process may heat the electronic components possibly resulting in undesirable parameter shifts and premature failure of the circuit.

The danger of circuit or device failure due to high sealing temperatures is even more acute when vitreous sealants are employed since such sealants have fusing temperatures above 400° C. While vitreous sealants are much less expensive than the previously discussed gold-tin alloy, the higher fusing temperatures have precluded the use of such glass sealants in cases where component heating is a problem.

Methods have been developed for sealing packages without unduly heating their contents; i.e. impulse or impact welding using either fixed or rolling electrodes. These techniques require metal covers and packages or, at the very least, metal sealing surfaces on both the cover and package. Unfortunately, the equipment needed to carry on such welding techniques is very expensive, and special tooling is required for each package size. The metal packages themselves are also relatively expensive.

The term "hot-capping" refers to a method for sealing either metallic or ceramic lids and packages using a metallic sealant. If either the lid or package is ceramic, it must have a metallic sealing surface fused thereto. The seal is effected by applying an electrically heated surface to the cover. However, since the cover must be heated to at least the sealing temperature, the temperature of the electronic component or circuit will be raised.

Since ceramic packages are less expensive than metallic packages, and since vitreous sealing materials are less expensive than metal based sealants, the most economical approach would be to use ceramic packages and covers and seal them with a vitreous sealant without requiring fused metallization sealing layers.

SUMMARY OF THE INVENTION

It is an object of the present invention to provide an improved method and apparatus for sealing electronic circuits.

It is a further object of the present invention to provide a method and apparatus for hermetically sealing a ceramic or metal cover to a ceramic package using a vitreous sealant without excessively heating the electronic components or circuit therein.

It is a still further object of the invention to provide a method and apparatus for hermetically sealing a ceramic or metallic cover to a ceramic package without requiring metallic sealing layers on the ceramic.

These objects are carried out by placing a heater preform (i.e. a heating element) at the sealing surface which becomes a permanent part of the seal. The preform is coupled to a source of energy, and only enough heat is generated to effect the seal thus minimizing the total quantity of heat produced. This, in conjunction with whatever external cooling techniques are employed, will substantially reduce the temperature rise of the electronic components.

According to a broad aspect of the invention, there is provided a heater preform for sealing a package containing electronic components to a lid when the preform is positioned between sealing surfaces of the package and lid and is heated to a predetermined temperature, comprising: a heater portion having an area and shape corresponding substantially to said sealing surface; and first and second contact portions coupled to said heater portion.

According to a further aspect of the invention, there is provided a method of hermetically sealing a package containing electronic components to a lid, said package and said lid having sealing surfaces, comprising: placing a heating element between the sealing surfaces of said package and said lid; and heating said heating element to effect a seal between said package and said lid.

According to a still further aspect of the invention, there is provided a method of joining first and second ceramic bodies each having a sealing surface, comprising: forming a first coating of glass on the sealing surfaces of said first and second bodies, said first coating having a coefficient of thermal expansion substantially equal to said first and second ceramic bodies; placing a metallic heating element between the sealing surfaces of said first and second bodies, said heating element being coated with a layer of glass having a coefficient of thermal expansion substantially equal to said heating element; and heating said heating element to melt the glass on said first and second bodies and on said heating element to produce a seal between said first and second bodies, said heating element becoming a permanent part of said seal.

According to yet another aspect of the invention, there is provided an apparatus for effecting a hermetic seal between an electronic component package and its lid wherein a sealing preform is placed between said package and said lid and contacts the sealing surfaces thereof, comprising: a stage onto which said package, preform and lid is positioned; first means for applying pressure to said package, preform and lid in a direction so as to compress said preform; and second means for heating said preform to effect said seal.

The above and other objects, features and advantages of the invention will be better understood from the following detailed description taken in conjunction with the accompanying drawings, in which:

BRIEF DESCRIPTION OF THE DRAWINGS

FIGS. 1a and 1b are top and side views, respectively, of a heater preform in accordance with the present invention;

FIGS. 2a, 2b, 2c, and 2d are top, bottom, side and end views, respectively, of a package for electrical components or circuits;

FIGS. 3a and 3b are bottom and end views, respectively, of a cover or lid which is to be sealed to the package of FIGS. 2a, 2b, 2c and 2d; and FIG. 4 is an exploded view of one embodiment of an apparatus for sealing the lid of FIGS. 3a and 3b to the package of FIGS. 2a, 2b, 2c and 2d using the heater preform of FIGS. 1a and 1b.

The present invention contemplates the use of two types of heater preforms; i.e. single material preforms and composite preforms. The single material heater preform is punched or etched from metal (e.g. copper) and is configured to fit the sealing area of a package. It is shaped so as to introduce heat where it will effect a seal most efficiently. Since the temperature and thermal output at any point on the preform varies inversely with the cross-sectional area perpendicular to the direction of current flow, the temperature and thermal output at any given point may be increased by narrowing the preform and holding its thickness constant at the given point. Of course, the same result may be accomplished by making the heater preform thinner and maintaining a constant width; however, it is preferable to maintain the thickness constant over the sealing area.

FIGS. 1a and 1b are top and side views, respectively, of a composite heater preform comprising a sealing portion 10 and ear portions 12. As was the case with the single material heater, the composite heater metal (e.g. chromium, copper, etc.) is punched or etched from metal sheets having a thickness of approximately 0.003 inches. The preform is coated on at least one, but preferably on both sides and edges with a sealing glass. The sealing glass which is compounded to match the expansion of the metal is fused to the metal to form a coating 14. Only the rectangular sealing portion 10 is coated. The ear portions 12 are not coated. One convenient method of applying the glass coating includes dipping the cleaned metallic preform into a slurry of frit, drying and then fusing in an oven. Ear portions 12 serve as contact areas which may be clamped to current conducting terminals for the purpose of passing a heating current through the preform. Since temperature rises as the width of the heater preform becomes smaller, ear portions 12 remain relatively cool. Small holes 16 at the entrance and exit points of the rectangular heating area serve to produce entrance and exit areas having somewhat elevated temperatures with respect to other portions of the heater. This compensates for cool spots which would otherwise exist due to the flow of heat out of the rectangular sealing area. If the metal of which the heater is made is sufficiently thin and/or ductile, one sealant glass matched in thermal expansion to aluminum oxide may be used and any disparity with that of the metal may be ignored.

Since it is more difficult to fuse glass to metal than it is to fuse glass to glass, it is recommended that the glass be fused to the metal heater in advance. This ensures the integrity of the glass to metal bond. If vitreous coatings are applied to the sealing faces on the cover and on the package in a similar manner, then the final hermetic seal will be glass-to-glass which is a simpler bond to achieve. By employing a sealant which is fabricated to have a coefficient of thermal expansion which matches that of the metal heater, and a glass having a coefficient of thermal expansion which matches that of the package and/or cover material, the glass-to-glass seal will tend to relieve some of the stress which builds when sealing materials of different coefficients of expansion. The glass seal will assume a coefficient of expansion intermediate that of the original glasses. Naturally, if the sealant is not vitreous, coating of all mating surfaces may not be necessary.

In addition to stress relief, the layers of glass on the cover and package tend to confine heat within the sealing area since glass is a poor conductor of heat. This results in a faster sealing cycle and reduces the possibility of package or cover breakage due to thermal shocks. The glass layer on heater 10 protects it also from overheating.

FIGS. 2a, 2b, 2c and 2d are top, bottom, side and end views of a package 18 (e.g. aluminum oxide), and FIGS. 3a and 3b are bottom and end views of a ceramic cover or lid 20 (e.g. aluminum oxide). Package 18 is equipped with a plurality of electrically conductive leads 22 extending therefrom as is well known in the art. Both package 18 and cover 20 have a layer of sealing glass 24 fused to their respective sealing areas illustrated as darkened areas. The sealing glass is compounded to have a coefficient of thermal expansion which matches that of the package and cover. The aluminum oxide sealing glass may be applied to the cover and package by silk-screen or other convenient method, and the glass may be most conveniently fused in an oven. The glass thickness may be in the order of 0.015 inches.

FIG. 4 illustrates one embodiment of an apparatus for sealing the cover and package of FIGS. 2 and 3 using the heater preform of FIG. 1. Package 20 is positioned on a stage 26 which is equipped with suitable alignment and holding fixtures 28. Stage 26 may be air or water cooled via feed and return lines 30 and 32 respectively. Heater 14 is placed over the sealing area of package 20, and ear portions 12 rest on electrical terminal blocks 34 and 36 which, when the circuit is complete, will carry a heating current via lines 38 and 40. Ear portions 12 are positioned on blocks 34 and 36 via apertures 42 in ear portions 12 and pegs 44 on blocks 34 and 36. Cover 18 is positioned with its glassed area in contact with the top of heater 14. A predetermined amount of downward pressure is then applied to cover 18 by a combination metallic holddown and heatsink 46 which may also be air or water cooled via feed and return lines 48 and 50. Contact plungers 52 are then lowered onto ear portions 12 to ensure good electrical contact between ear portions 12 and terminal blocks 34 and 36. A heating current is then passed through the heater via terminal blocks 34 and 36 and ears 12 to effect the glass seal.

In cases where devices which are hermetically sealed fail to pass leak tests, it is ordinarily very difficult to remove the cover without damaging the contents either thermally or mechanically. Using the process described above, cap removal is made relatively simple. That is, by reheating the heater 14, the sealant may be softened and the cover removed. The package may be resealed using new covers and heaters if necessary. Of course, the cap removal process is simpler if heating ears or tabs 12 have not yet been removed; however, even if they have, the cap may be removed using specially designed contacting electrodes. Finally, if the failure is due to a leak in the seal, it may be sufficient to merely reheat and reflow the sealant.

It should be apparent that the process described above may be easily adapted to mechanized or automated procedures. The heater preforms may be fabricated as continuous strips or rolls which are automatically fed to the sealing area. The packages and covers may also be transported automatically, and the electrical contacts may be made by plungers which are activated hydraulically, pneumatically or electrically.

In summary, the above describes a process for sealing packages and covers using a heating device or preform applied directly at the sealing area and which becomes an intergral part of the seal. The process may involve a special form of soldering, welding, cohesion, or adhesion, depending on the type of sealant used. To initiate the sealing process, heat is applied to fuse vitreous or metallic materials together or to cure an organic adhesive such as epoxy. The heat may be generated by (a) passing current through the heating device from an external source; (b) inducing current flow through the heating device by electrical induction; (c) dielectric heating using a proper dielectric material at the sealing area; and (d) applying heat to a projecting tab with the sealing temperatures achieved by thermal conduction. In the case of dielectric heating, the heater device or preform may or may not be the bonding material also and need not be electrically conductive. The heater device material (exclusive of its coating) may be (a) metal such as copper, chromium, aluminum, kovar, steel, etc; (b) vitreous such as glasses, vitreous enamels or other ceramics; or (c) conductive coating such as ceramic glazes and thick film inks.

For heater preforms requiring electrical connections, projecting tabs or ears, which may be removable, are provided. Special contacting probes may also be employed to carry current to the heater, in which case projecting tabs or ears would be unnecessary. For inductive or dielectric heating, contacting means are unnecessary.

If heating by electrical conduction is desired, a power supply is furnished to provide the proper electrical current at each instant over a given time interval. The current profile is chosen to optimize the sealing process while taking into account the maximum temperatures to which the electronic components may be subjected. Power sources for conductive heating are simple while those for inductive or dielectric heating are no more complex than those currently being used.

If a metallic sealant is desired, three types of seal may be made. First, a high temperature seal may be made wherein the heater is used only to provide heat to melt and weld sealing areas of the package, cap and, perhaps, the heater itself together. For this to work most efficiently, the resistance of the heater must be low with respect to the resistance of the package and lid. A variation of this approach involves the fusing of a ceramic by cofiring tungsten. A tungsten heater coated with a metal or alloy having a lower melting point could be used.

A second type of metallic seal involves the use of a single metal heater device or preform. The heater in this case is really a solder preform which melts to bond adjacent sealing surfaces which have been prepared to be compatible to a soldering operation by pretinning, plating, or other procedure. Since the sealing surface is adjacent to a mass which absorbs heat, special care must be taken (when using conductive current heating) not to melt the tabs or ears.

Third, a metal heater may be coated with, for example, a tin-lead alloy or, perhaps, an alloy of 80% AV and 20% Sn. If the heater is made of a highly conductive material (e.g. copper, aluminum, etc.) much of the heat will be generated in the heater and the remainder in the solder. This method would be most useful with nonconductive packages and lids having metallic sealing areas fused thereto.

The above description is given by way of example only. Changes in form and details may be made by one skilled in the art with departing from the scope of the invention as defined by the appended claims.

What is claimed is:

1. An apparatus for effecting a hermetic seal between an electronic component package and its lid wherein a sealing preform having first and second contact tabs is placed between said package and said lid and contacts the sealing surfaces thereof, comprising:
   (a) a stage onto which said package, preform and lid is positioned;
   (b) first means for applying pressure to said package, preform and lid in a direction so as to compress said preform; and
   (c) second means for heating said preform to effect said seal, said second means having a third means for passing an electrical current through said preform, said third means includes: (a) first and second terminal blocks on which said first and second tabs are positioned; (b) first and second plungers for securing said first and second tabs on said first and second terminal block; and (c) a source of current coupled to said first and second terminal blocks.

* * * * *